(12) United States Patent  (10) Patent No.: US 8,201,617 B2
Ye et al.  (45) Date of Patent: Jun. 19, 2012

(54) HEAT SINK AND LATCH MECHANISM THEREOF

(75) Inventors: Zhen-Xing Ye, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 546 days.

(21) Appl. No.: 12/425,393

(22) Filed: Apr. 17, 2009

(65) Prior Publication Data

US 2010/0243206 A1  Sep. 30, 2010

(30) Foreign Application Priority Data

Mar. 24, 2009  (CN) .......................... 2009 1 0301094

(51) Int. Cl.
*H05K 7/20* (2006.01)
(52) U.S. Cl. .......... 165/80.3; 24/459; 257/719; 361/704
(58) Field of Classification Search ................. 165/80.3; 361/704; 257/718, 719; 24/457, 459, 518
See application file for complete search history.

(56) References Cited

U.S. PATENT DOCUMENTS

| | | | | |
|---|---|---|---|---|
| 5,208,731 A * | 5/1993 | Blomquist | .................... | 361/704 |
| 5,477,916 A * | 12/1995 | Lin | .............................. | 165/80.3 |
| 5,493,475 A * | 2/1996 | Lin | .............................. | 165/185 |
| 5,509,465 A * | 4/1996 | Lai | ............................... | 165/80.3 |
| 5,808,236 A * | 9/1998 | Brezina et al. | .............. | 165/80.3 |
| 6,012,510 A * | 1/2000 | Cook | ........................... | 165/80.3 |
| 6,101,091 A * | 8/2000 | Baik | ........................... | 361/704 |
| 6,414,848 B1 * | 7/2002 | Chen | ........................... | 361/704 |
| 6,466,443 B1 * | 10/2002 | Chen | ........................... | 165/80.3 |
| 6,625,021 B1 * | 9/2003 | Lofland et al. | .............. | 165/80.3 |
| 6,707,672 B2 * | 3/2004 | Liu | ................................ | 361/704 |
| 6,731,506 B1 * | 5/2004 | Dong et al. | .................. | 361/719 |
| 6,768,641 B2 * | 7/2004 | Li | ................................. | 165/80.3 |
| 6,822,869 B2 * | 11/2004 | Huang et al. | ................. | 361/704 |
| 6,988,871 B2 * | 1/2006 | Deboer et al. | ............... | 361/704 |
| 7,301,774 B2 * | 11/2007 | Lee et al. | ..................... | 165/80.3 |
| 7,505,271 B2 * | 3/2009 | Chen | ............................ | 361/704 |
| 2005/0174739 A1 * | 8/2005 | Chen et al. | .................... | 361/704 |

* cited by examiner

*Primary Examiner* — Leonard R Leo
(74) *Attorney, Agent, or Firm* — Altis Law Group, Inc.

(57) ABSTRACT

A latch mechanism includes a press portion, two connection portions, and two latch portions. The two connection portions are connected to opposite ends of the press portion correspondingly. Each connection portion includes two connectors. First ends of the two connectors are connected together to form a coupling end to connected to a corresponding end of the press portion. Each latch portion is selectively connected to the second end of one of the two connectors of a corresponding connection portion.

16 Claims, 2 Drawing Sheets

HEAT SINK AND LATCH MECHANISM THEREOF

BACKGROUND

1. Technical Field

The present disclosure relates to a heat sink and a latch mechanism of the heat sink.

2. Description of Related Art

Heat sinks are mounted in computer systems to cool components of the computer systems. In use, a heat sink is clung to a top surface of a component, and fixed on the component via a latch mechanism being snapped by clasps of a motherboard of the computer system. As a result, heat radiated from the component can be conducted to air. However, according to specifications of most motherboards, clasps of a motherboard are usually immovable. As a result, one type of a latch mechanism cannot be used for different motherboards.

DETAILED DESCRIPTION

Figure 1:
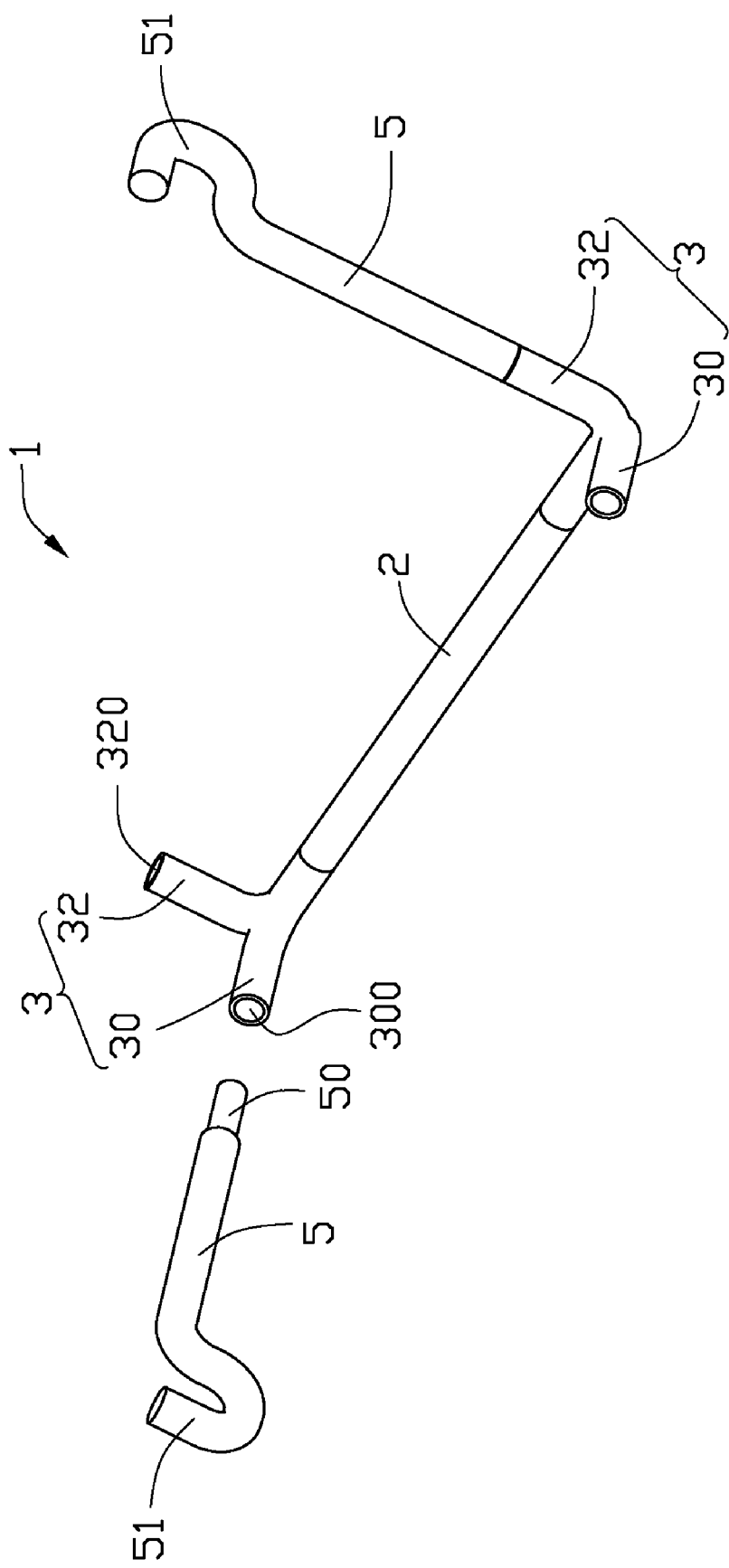
FIG. 1 is an isometric view of an exemplary embodiment of a latch mechanism.

Referring to FIG. 1, an exemplary embodiment of a latch mechanism 1 includes a press portion 2, two connection portions 3, and two latch portions 5. Each connection portion 3 is connected between the press portion 2 and a corresponding latch portion 5.

Each connection portion 3 is substantially Y-shaped and includes a first connector 30 and a second connector 32. First ends of the first, second connectors 30 and 32 are connected together to form a coupling end, and the coupling end is capable of being pivotably coupled with a corresponding end of the press portion 2, along a direction substantially perpendicular to the connectors 30 and 32. A first hole 300 is defined in a second end opposite to the first end of the first connector 30. A second hole 320 is defined in a second end opposite to the first end of the second connector 32. In one embodiment, an angle between the first, second connectors 30 and 32 can be adjusted according to need.

A first end 50 of each latch portion 5 is cylinder-shaped, for being engaged in the first hole 300 or the second hole 320. A second end of each latch portion 5 forms a C-shaped hook 51.

In other embodiments, the first end 50 of each latch portion 5 can be other shapes. As a result, holes with corresponding shapes are defined in the second ends of the first, second connectors 30 and 32 to make the latch portions 5 be engaged with the first, second connectors 30 and 32.

Figure 2:
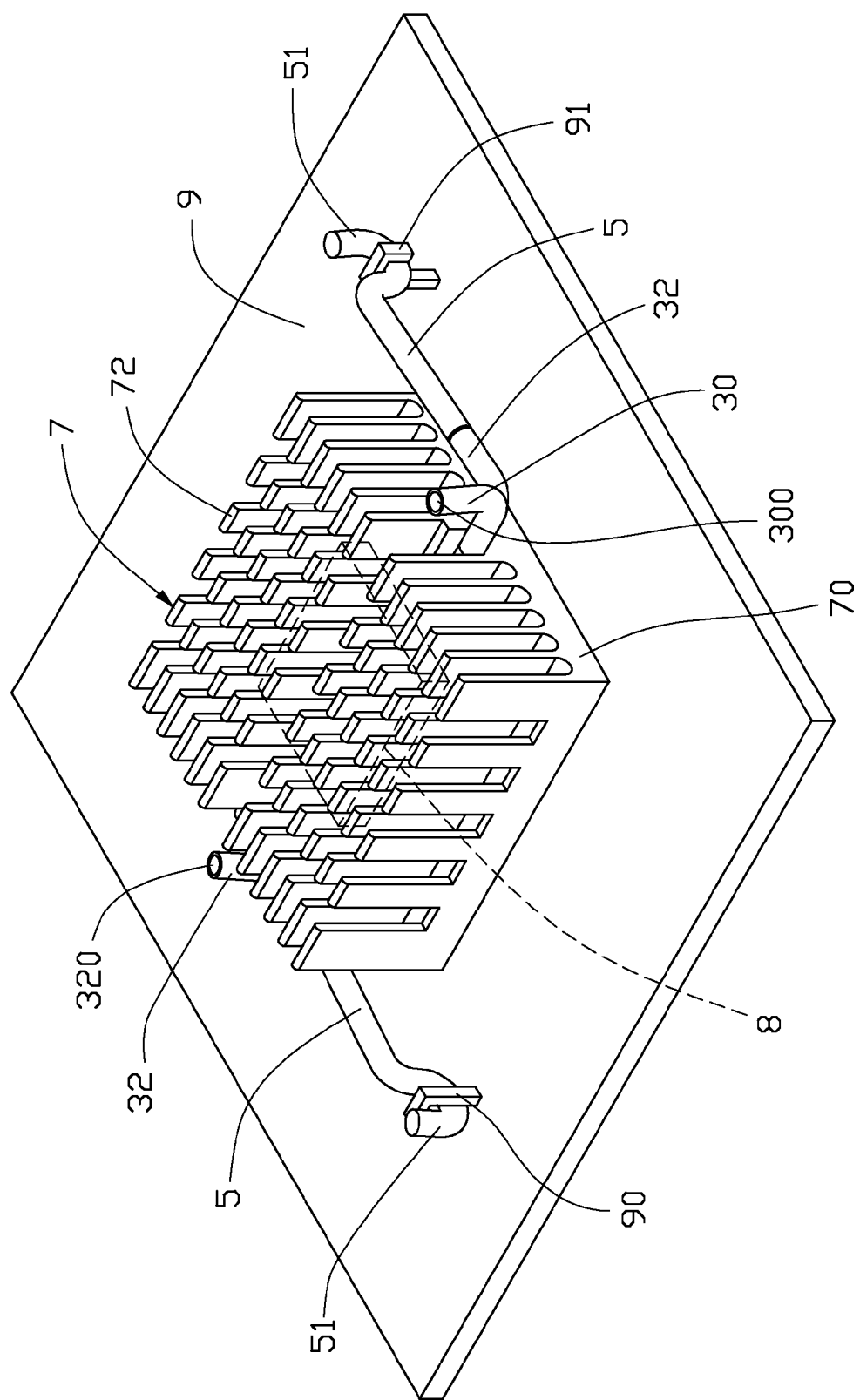
FIG. 2 is an isometric, assembled view of an exemplary embodiment of a heat sink using the latch mechanism of FIG. 1 mounted on a component.

Referring to FIG. 2, an exemplary embodiment of a heat sink 7 is configured to be fixed on a top surface of a component, such as a central processing unit (CPU) 8. The heat sink 7 includes a base 70 and a plurality of fins 72 perpendicularly extending up from the base 70. The CPU 8 is located on a motherboard 9. Two hooks 90 and 91 are projected on the motherboard 9.

In use, the latch mechanism 1 is bestridden on the heat sink 7. In other words, the press portion 2 is located between two adjacent fins 72 of the heat sink 7 and contacting with the base 70 of the heat sink 7. The first end 50 of one of the two latch portions 5 is engaged in the first hole 300 of the first connector 30 of one of the two connection portions 3. The first end 50 of the other latch portion 5 is engaged in the second hole 320 of the second connector 32 of the other connection portion 3. In addition, the hooks 51 of the latch portions 5 are engaged with the hooks 90 and 91 of the motherboard 9, respectively. As a result, the heat sink 7 is fixed on the CPU 8.

In other embodiments, the first end 50 of the latch portions 5 can be engaged in the second hole 300 of the first connector 30 of the connection portions 3. The first end 50 of the other latch portion 5 can be engaged with the first connector 32 of the other connection portion 3. In addition, the latch portions 5 can be rotatably adjusted relative to the press portion 2. As a result, the latch mechanism 1 can be used for different motherboards which have hooks on different positions.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A latch mechanism comprising:
   a press portion;
   two connection portions connected to opposite ends of the press portion correspondingly, wherein each connection portion comprises two connectors, each connector comprises a first end and a second end, first ends of the two connectors are connected together to form a coupling end connected to a corresponding end of the press portion; and
   two latch portions, wherein each latch portion is selectively connected to the second end of one of the two connectors of a corresponding connection portion and the other of the two connectors is unused.

2. The latch mechanism of claim 1, wherein each connection portion is substantially Y-shaped.

3. The latch mechanism of claim 1, wherein the coupling ends of the two connection portions are pivotably coupled with the opposite ends of the press portion correspondingly.

4. The latch mechanism of claim 3, wherein each coupling end is coupled to the press portion along a direction substantially perpendicular to the two corresponding connectors.

5. The latch mechanism of claim 1, wherein a hole is defined in the second end of each connector, a first end of each latch portion is cylinder-shaped for being engaged in the hole.

6. The latch mechanism of claim 5, wherein each latch portion comprises a C-shaped hook extending from a second end opposite to the first end of each latch portion.

7. A heat sink comprising:
   a base;
   a plurality of fins extending up from a top of the base;
   a press portion located between two adjacent fins of the plurality of fins, to resist against the top of the base;
   two connection portions connected to opposite ends of the press portion correspondingly, wherein each connection portion comprises two connectors, each connector comprises a first end and a second end, first ends of the two connectors are connected together to form a coupling end to be connected to a corresponding end of the press portion, a hole is defined in the second end of each connector; and two latch portions, wherein each latch portion is selectively connected to the second end of one of the two connectors of a corresponding connection portion, a first end of each latch portion is cylinder-shaped for being engaged in the hole of the second end of each connector.

8. The heat sink of claim 7, wherein each connection portion is substantially Y-shaped.

9. The heat sink of claim 7, wherein the coupling ends of the two connection portions are pivotably coupled with the opposite ends of the press portion correspondingly.

10. The heat sink of claim 9, wherein each coupling end is coupled to the press portion along a direction substantially perpendicular to the two corresponding connectors.

11. The heat sink of claim 7, wherein each latch portion comprises a C-shaped hook extending from a second end opposite to the first end of each latch portion.

12. A latch mechanism comprising:

a press portion;

two connection portions connected to opposite ends of the press portion correspondingly, wherein each connection portion comprises two connectors, each connector comprises a first end and a second end, first ends of the two connectors are connected together to form a coupling end to be pivotably connected to a corresponding end of the press portion; and two latch portions, wherein each latch portion is selectively connected to the second end of one of the two connectors of a corresponding connection portion.

13. The latch mechanism of claim 12, wherein each connection portion is substantially Y-shaped.

14. The latch mechanism of claim 12, wherein each coupling end is coupled to the press portion along a direction substantially perpendicular to the two corresponding connectors.

15. The latch mechanism of claim 12, wherein a hole is defined in the second end of each connector, a first end of each latch portion is cylinder-shaped for being engaged in the hole.

16. The latch mechanism of claim 15, wherein each latch portion comprises a C-shaped hook extending from a second end opposite to the first end of each latch portion.

* * * * *